United States Patent
Doornbos et al.

(10) Patent No.: US 11,322,519 B2
(45) Date of Patent: May 3, 2022

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Gerben Doornbos, Kessel-Lo (BE); Mauricio Manfrini, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/030,334

(22) Filed: Sep. 23, 2020

(65) Prior Publication Data

US 2021/0375887 A1    Dec. 2, 2021

Related U.S. Application Data

(60) Provisional application No. 63/030,930, filed on May 28, 2020.

(51) Int. Cl.
| | | |
|---|---|---|
| *H01L 29/78* | (2006.01) | |
| *H01L 27/11* | (2006.01) | |
| *H01L 27/1159* | (2017.01) | |
| *H01L 29/66* | (2006.01) | |
| *H01L 29/51* | (2006.01) | |

(52) U.S. Cl.
CPC ........ *H01L 27/1159* (2013.01); *H01L 29/516* (2013.01); *H01L 29/6684* (2013.01); *H01L 29/78391* (2014.09)

(58) Field of Classification Search
CPC ............... H01L 27/1159; H01L 29/516; H01L 29/6684; H01L 29/78391
USPC .......................................................... 257/295
See application file for complete search history.

(56) References Cited

U.S. PATENT DOCUMENTS

| | | | |
|---|---|---|---|
| 2019/0207009 A1* | 7/2019 | Yamaguchi | ..... H01L 21/823462 |
| 2021/0202484 A1* | 7/2021 | Hwu ................ | H01L 29/40117 |
| 2021/0375891 A1* | 12/2021 | Young ................ | H01L 23/5226 |
| 2021/0376162 A1* | 12/2021 | Van Dal ............. | H01L 29/0665 |

(Continued)

OTHER PUBLICATIONS

Pavan Nukala et al., "Direct Epitaxial Growth of Polar (1-x)HfO2-(x)ZrO2 Ultrathin Films on Silicon", Applied Electronic Materials, Nov. 2019, pp. 2585-2593.

(Continued)

*Primary Examiner* — Sheikh Maruf
(74) *Attorney, Agent, or Firm* — JCIPRNET

(57) ABSTRACT

A semiconductor includes a ferroelectric layer, a first semiconductor layer, a first gate, a second semiconductor layer, a second gate and contact structures. The ferroelectric layer has a first surface and a second surface opposite to the first surface. The first semiconductor layer is disposed on the first surface of the ferroelectric layer. The first gate is disposed on the first semiconductor layer over the first surface. The second semiconductor layer is disposed on the second surface of the ferroelectric layer. The second gate is disposed on the second semiconductor layer over the second surface. The contacts structures are connected to the first semiconductor layer and the second semiconductor layer.

15 Claims, 17 Drawing Sheets

(56) References Cited

U.S. PATENT DOCUMENTS

2021/0391470 A1* 12/2021 Manfrini .......... H01L 29/40111

OTHER PUBLICATIONS

Simon Fichtner et al., "AlScN: A III-V semiconductor based ferroelectric", Journal of Applied Physics, Mar. 2019, pp. 1-8.
Michael S. Richman et al., "Ferroelectric system dynamics simulated by a second-order Landau model", Journal of Applied Physics, Sep. 2017, pp. 1-25.
Abbagari Souleymanou et al., "The propagation of waves in thin-film ferroelectric materials", Pramana—Journal of Physics, May 2019, pp. 1-6.

* cited by examiner

SEMICONDUCTOR DEVICE AND METHOD OF FABRICATING THE SAME

CROSS-REFERENCE TO RELATED APPLICATION

This application claims the priority benefit of U.S. provisional application Ser. No. 63/030,930, filed on May 28, 2020. The entirety of the above-mentioned patent application is hereby incorporated by reference herein and made a part of this specification.

BACKGROUND

Many modern-day electronic devices contain electronic memory configured to store data. Electronic memory may be volatile memory or non-volatile memory. Volatile memory stores data while it is powered, while non-volatile memory is able to store data when power is removed. Non-volatile memory based on ferroelectric field-effect transistor (Fe-FET) is one promising candidate for the next generation non-volatile memory technology. This is because Fe-FET based memory devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
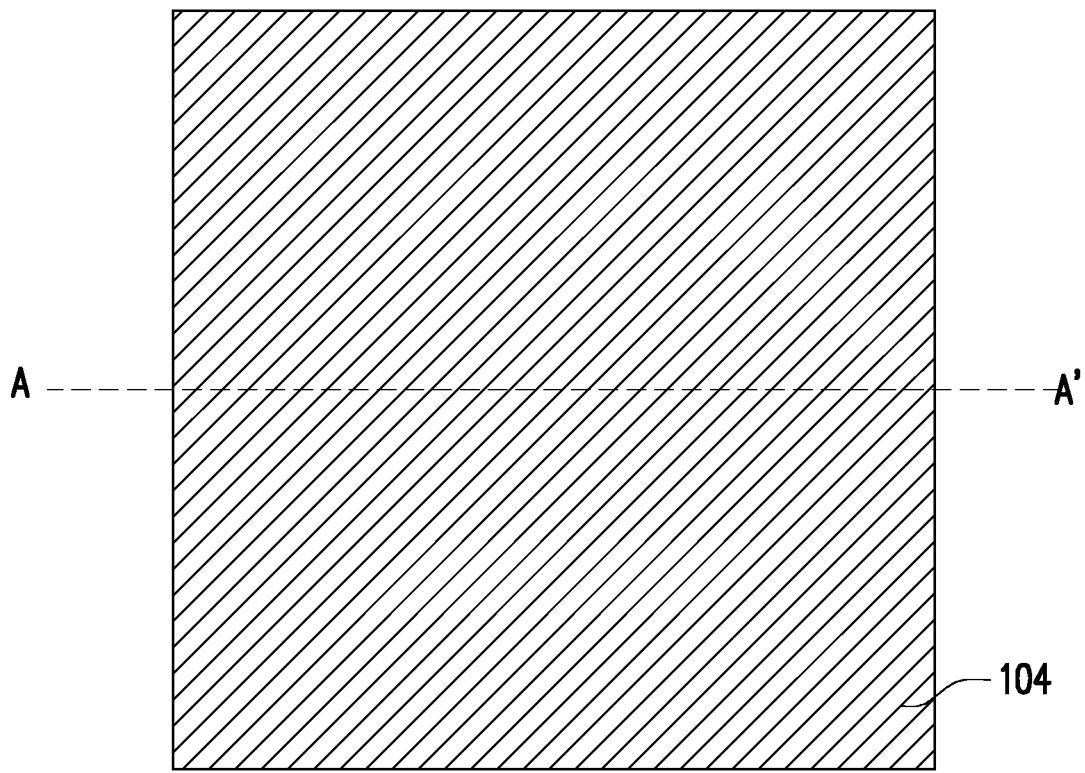
FIG. 1A to FIG. 9B are schematic top views and sectional views of various stages in a method of fabricating a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric field-effect transistor (Fe-FET) is generally used as a single transistor, and reading of such transistor using a normal differential sense amplifier is impossible. Although using two Fe-FET to make a differential pair may be attempted, however, this consumes two times the area, and requires two complementary write operations. In the embodiments of the present disclosure, a differential pair Fe-FET with a more compact structure is designed, and the states of the two Fe-FETs are always complementary.

FIG. 1A to FIG. 9B are schematic top views and sectional views of various stages in a method of fabricating a semiconductor device according to some embodiments of the present disclosure. Embodiments will be described with respect to a specific context, namely a semiconductor device, such as a ferroelectric field-effect transistor (Fe-FET) based memory device. Other embodiments may also be applied, however, to other circuits and layouts. Throughout the various views and illustrative embodiments, like reference numbers are used to designate like elements.

Figure 1B:
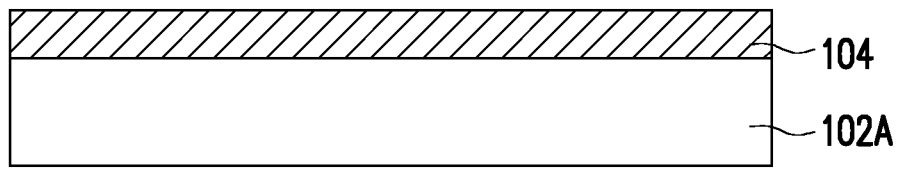

FIG. 1A is a top view of one stage in a method of fabricating a semiconductor device according to some embodiments of the present disclosure. FIG. 1B is a sectional view of the structure shown in FIG. 1A taken along the line A-A'. Referring to FIG. 1A and FIG. 1B, a dielectric layer 102A (or interlayer dielectric layer) is provided. In some embodiments, the dielectric layer 102A is provided over a substrate (not shown) compatible with a back-end-of-line (BEOL) process of the semiconductor device.

The dielectric layer 102A is for example made of dielectric materials such as silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 102A is made of low-K dielectric materials such as BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It should be noted that the low-k dielectric materials are generally dielectric materials having a dielectric constant lower than 3.9. The dielectric layer 102A may be formed by any suitable method, such as chemical vapor deposition (CVD), spin-on, sputtering, or the like. After forming the dielectric layer 102A, a metal layer 104 is formed over the dielectric layer 102A. In some embodiments, the metal layer 104 includes a metal material such as W, Ti, TiN, TaN, TiAl, Mo, the like, or combinations thereof. Furthermore, the metal layer 104 may be formed by suitable deposition techniques, or the like.

Figure 2A:
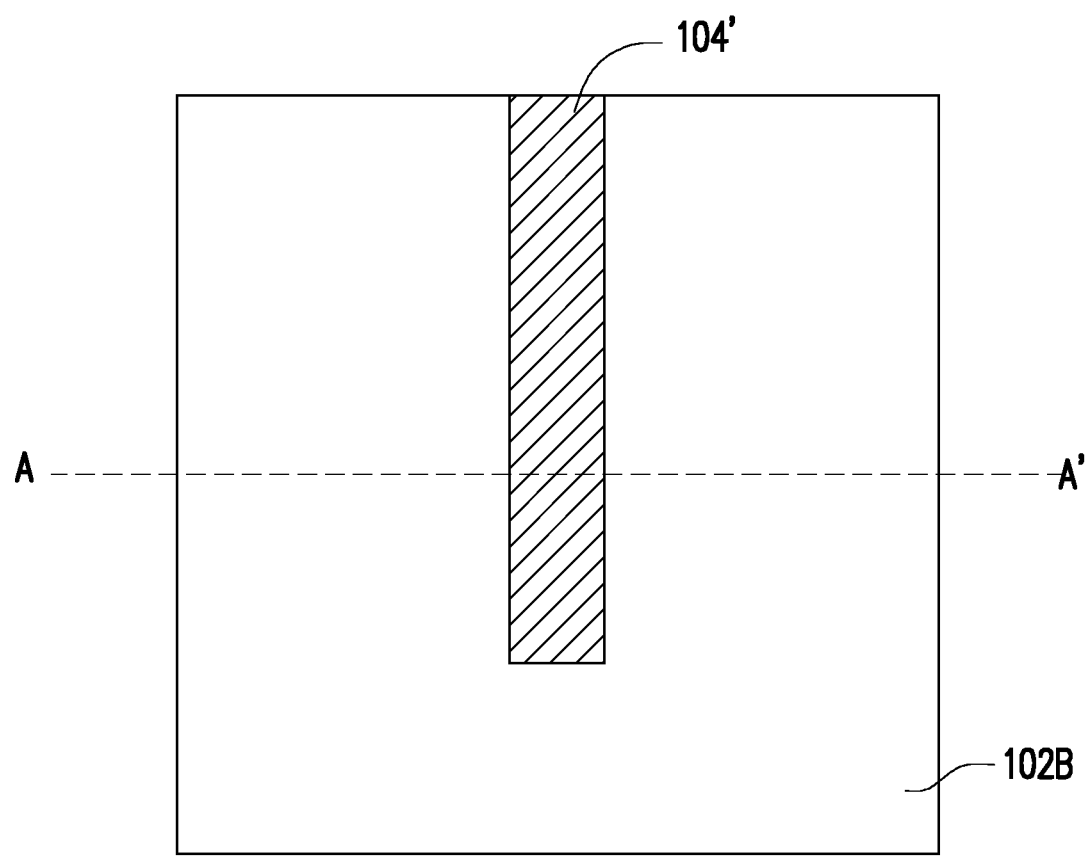
Figure 2B:
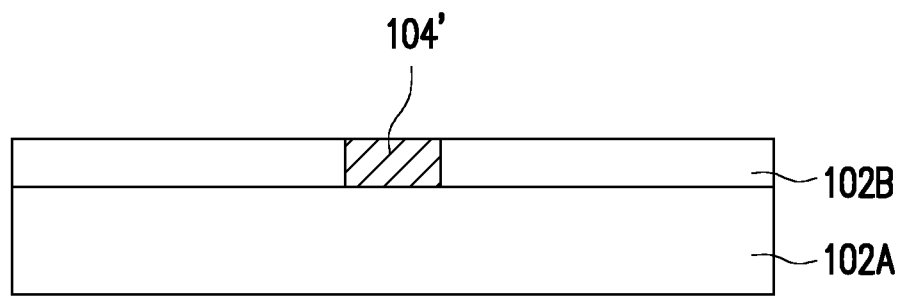

FIG. 2A is a top view of one stage in a method of fabricating a semiconductor device according to some embodiments of the present disclosure. FIG. 2B is a sectional view of the structure shown in FIG. 2A taken along the line A-A'. Referring to FIG. 2A and FIG. 2B, in a subsequent step, the metal layer 104 is patterned to form a first gate 104' (or first gate electrode). After forming the first gate 104', a dielectric layer 102B (or interlayer dielectric layer) is formed over the dielectric layer 102A to cover and surround the first gate 104'. The dielectric layer 102B may be formed by the same method and be formed of similar materials as described for the dielectric layer 102A, thus its detailed description will be omitted herein. Subsequently, a planarization process (e.g., a chemical-mechanical planarization (CMP) process) is performed to remove excessive dielectric materials of the dielectric layer 102B so that a top surface of the first gate 104' is coplanar (or aligned) with a top surface of the dielectric layer 102B.

Figure 3A:
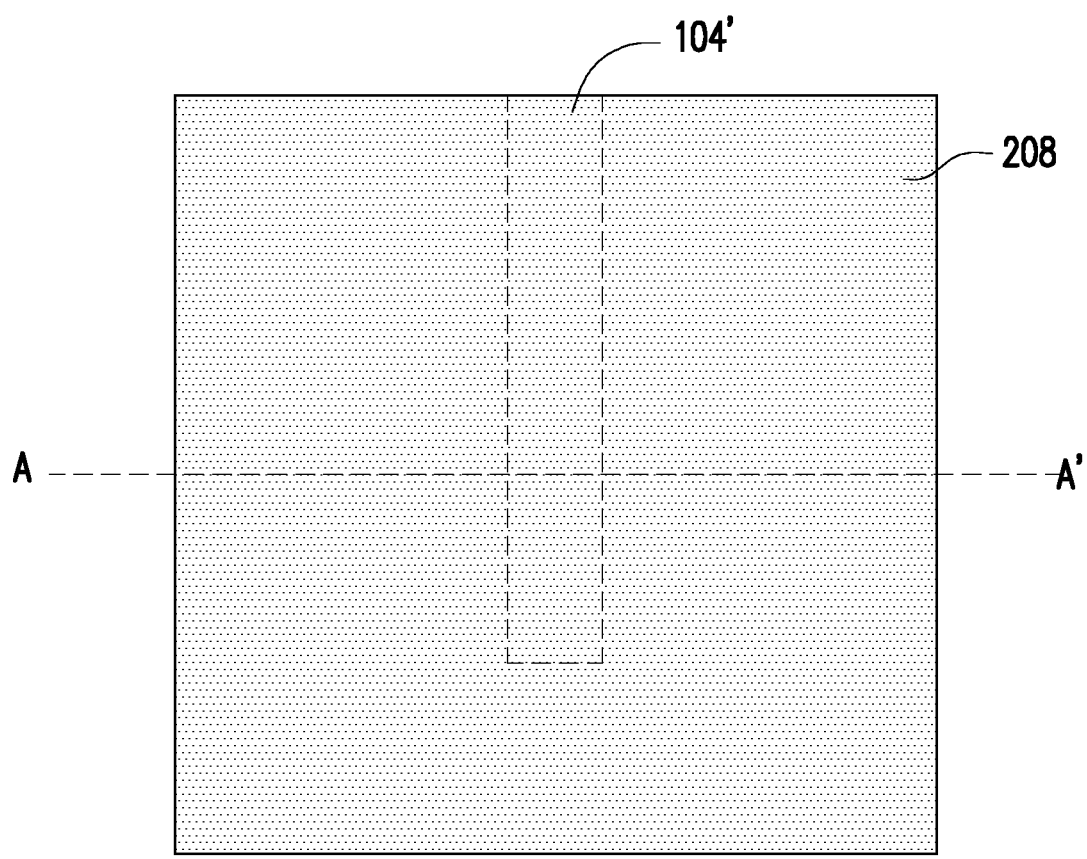
Figure 3B:
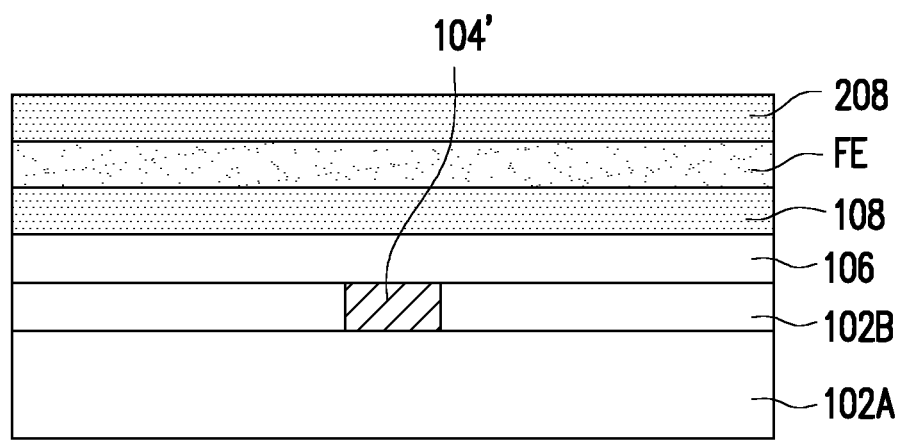

FIG. 3A is a top view of one stage in a method of fabricating a semiconductor device according to some embodiments of the present disclosure. FIG. 3B is a sectional view of the structure shown in FIG. 3A taken along the line A-A'. Referring to FIG. 3A and FIG. 3B, in a subsequent step, a first gate dielectric 106, a first semiconductor layer 108 (or first channel layer), a ferroelectric layer FE (or an insulating layer/ferroelectric insulating layer) and a second semiconductor layer 208 are sequentially formed over the dielectric layer 102B along a first direction (build-up direction) and on the first gate 104'. For example, the first gate dielectric 106 is disposed on the dielectric layer 102B in between the first gate 104' and the first semiconductor layer 106. Furthermore, the ferroelectric layer FE is disposed on the first semiconductor layer 108 in between the second semiconductor layer 208 and the first semiconductor layer 108.

In the exemplary embodiment, the first gate dielectric 106 include high-k dielectric materials such as aluminum oxide ($Al_2O_3$), hafnium oxide ($HfO_2$), hafnium lanthanum oxide (HfLaO), or the like. The first gate dielectric 106 may be formed by any suitable method, such as chemical vapor deposition (CVD), or the like. In some embodiments, the first semiconductor layer 108 (or first channel layer) and the second semiconductor layer 208 (or second channel layer) are made of oxide semiconductor materials such as indium-gallium-zinc oxide (InGaZnO), gallium oxide ($Ga_2O_3$), indium oxide ($In_2O_3$), zinc oxide (ZnO), indium tin oxide (ITO), or the like. In some alternative embodiments, the semiconductor layer 108 (or first channel layer) and the second semiconductor layer 208 (or second channel layer) are made of III-N semiconductor materials such as gallium nitride (GaN), indium nitride (InN), indium gallium nitride (InGaN), or the like. In some alternative embodiments, the semiconductor layer 108 (or first channel layer) and the second semiconductor layer 208 (or second channel layer) are made of group-IV semiconductor materials such as silicon (Si), germanium (Ge), silicon germanium (SiGe), or the like. The first semiconductor layer 108 and the second semiconductor layer 208 may be formed of the same material or be formed of different materials, and may be formed by any suitable method, such as atomic layer deposition (ALD), chemical vapor deposition (CVD), metal organic chemical vapor deposition (MOCVD), plasma enhanced chemical vapor deposition (PECVD), sputtering or the like. Furthermore, the first semiconductor layer 108 and the second semiconductor layer 208 may be single crystalline, poly crystalline, or amorphous.

In some embodiments, the ferroelectric layer FE (or insulating layer/ferroelectric insulating layer) comprises a ferroelectric material selected from the group consisting of silicon doped hafnium oxide ($Si:HfO_2$), hafnium zirconium oxide ($HfZrO_2$), aluminum scandium nitride (AlScN) and aluminum yttrium nitride (AlYN). For example, when the first semiconductor layer 108 (or first channel layer) and the second semiconductor layer 208 (or second channel layer) are made of oxide semiconductor materials, then the ferroelectric layer FE (or insulating layer/ferroelectric insulating layer) is a high-k material such as silicon doped hafnium oxide ($Si:HfO_2$) or hafnium zirconium oxide ($HfZrO_2$). In certain embodiments, when the first semiconductor layer 108 (or first channel layer) and the second semiconductor layer 208 (or second channel layer) are made of III-N semiconductor materials, then the ferroelectric layer FE (or insulating layer/ferroelectric insulating layer) is aluminum scandium nitride (AlScN) or aluminum yttrium nitride (AlYN). In one embodiment, aluminum scandium nitride (AlScN) can be monolithically deposited/formed (i.e. in a single-crystalline manner) on the first semiconductor layer 108 as the ferroelectric layer FE. In addition, the ferroelectric layer FE may be formed through suitable deposition techniques, such as atomic layer deposition (ALD), chemical vapor deposition (CVD), metal organic chemical vapor deposition (MOCVD), plasma enhanced chemical vapor deposition (PECVD), sputtering or the like.

Figure 4A:
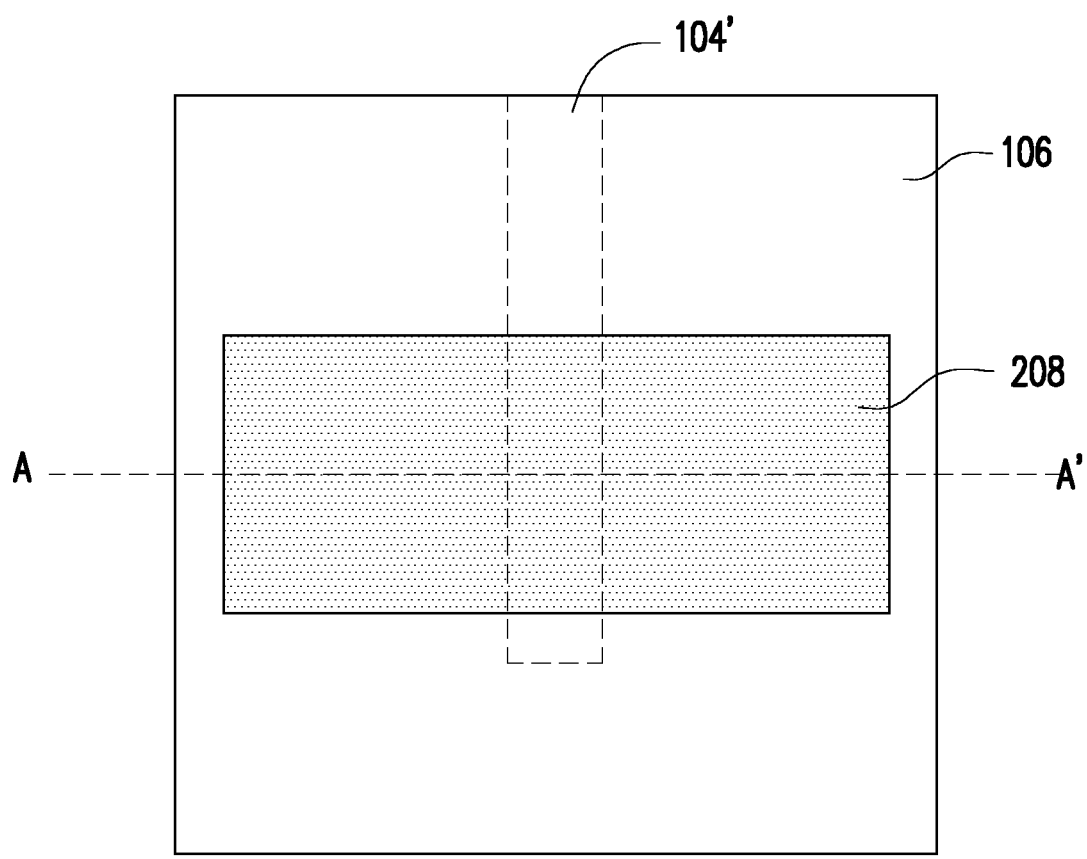
Figure 4B:
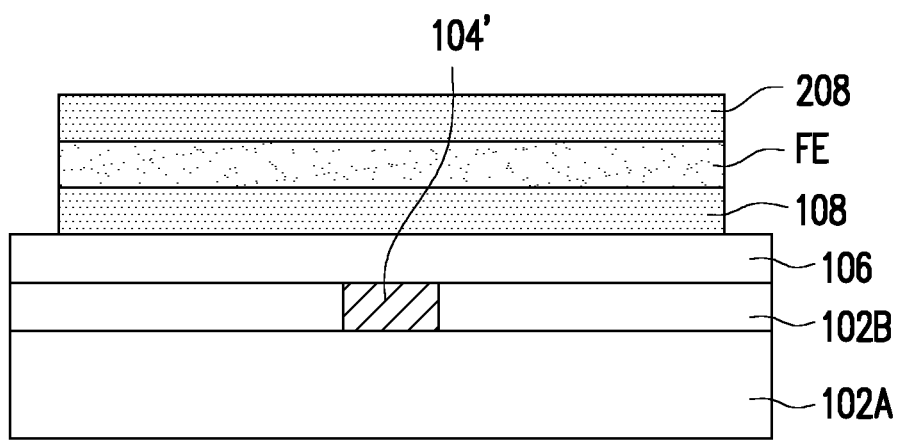

FIG. 4A is a top view of one stage in a method of fabricating a semiconductor device according to some embodiments of the present disclosure. FIG. 4B is a sectional view of the structure shown in FIG. 4A taken along the line A-A'. Referring to FIG. 4A and FIG. 4B, in a next step, portions of the first semiconductor layer 108, the ferroelectric layer FE and the second semiconductor layer 208 are further removed by patterning or etching processes. For example, the first semiconductor layer 108, the ferroelectric layer FE and the second semiconductor layer 208 are patterned to reveal portions of the first gate dielectric 106 located underneath. In some embodiments, the first semiconductor layer 108, the ferroelectric layer FE and the second semiconductor layer 208 are patterned together so that sidewalls of the ferroelectric layer FE are aligned with sidewalls of the first semiconductor layer 108 and the second semiconductor layer 208.

Figure 5A:
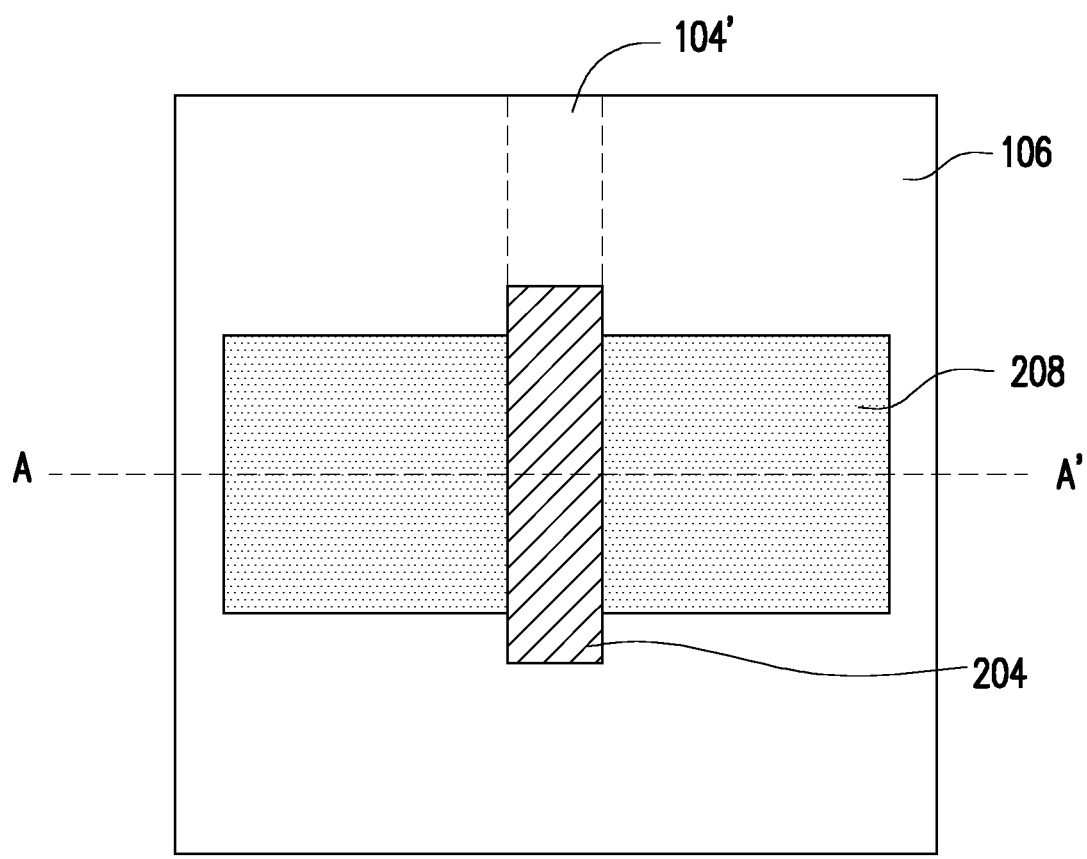
Figure 5B:
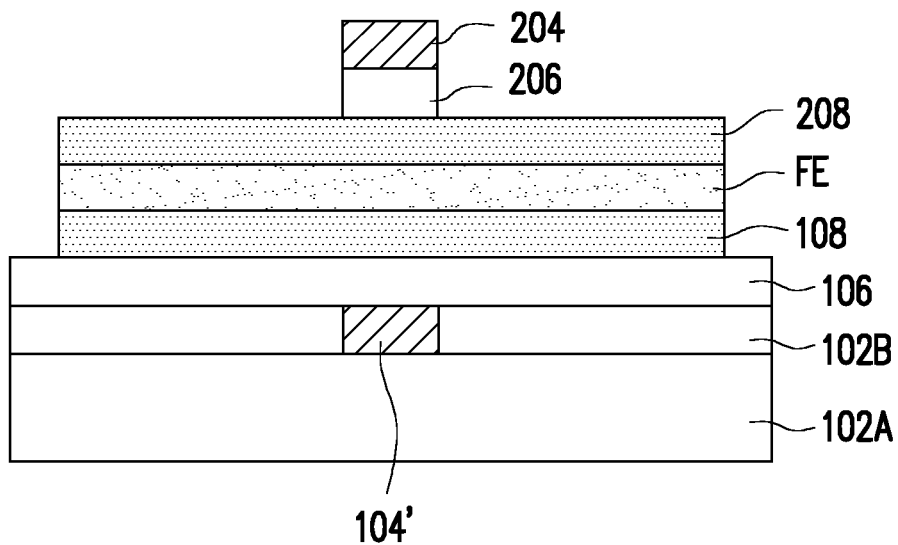

FIG. 5A is a top view of one stage in a method of fabricating a semiconductor device according to some embodiments of the present disclosure. FIG. 5B is a sectional view of the structure shown in FIG. 5A taken along the line A-A'. Referring to FIG. 5A and FIG. 5B, after the patterning or etching process, a second gate dielectric 206 and a second gate 204 are formed over the second semiconductor layer 208. For example, the second gate dielectric 206 is formed on and in contact with the second semiconductor layer 208, whereas the second gate 204 is formed on and in contact with the second gate dielectric 206.

In the exemplary embodiment, the second gate dielectric 206 include high-k dielectric materials such as aluminum oxide ($Al_2O_3$), hafnium oxide ($HfO_2$), hafnium lanthanum oxide (HfLaO), or the like. The second gate dielectric 206 may be formed by any suitable method, such as chemical vapor deposition (CVD), or the like. Furthermore, in some embodiments, the second gate 204 is formed by a metal material such as W, Ti, TiN, TaN, TiAl, Mo, the like, or combinations thereof. The second gate 204 may be formed by suitable deposition techniques, or the like. In certain embodiments, the second gate dielectric 206 and the second gate 204 are formed to have sidewalls that are aligned with one another through patterning or etching processes.

Figure 6A:
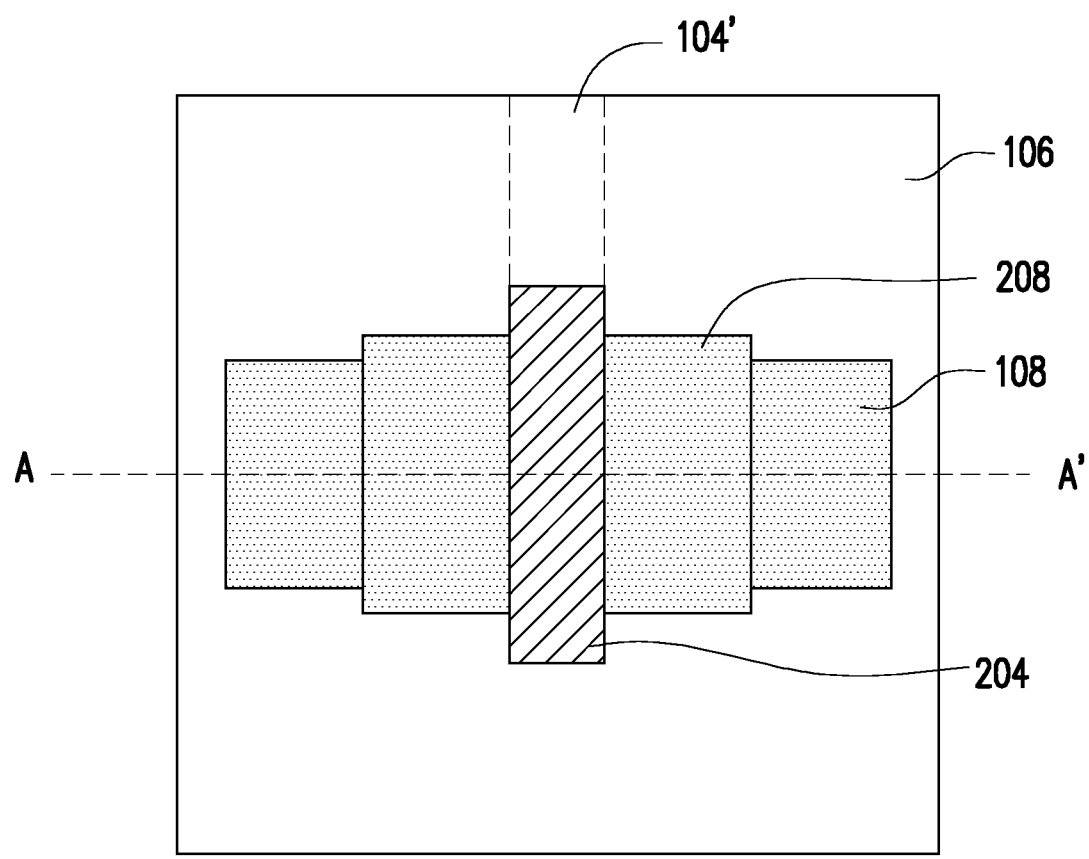
Figure 6B:
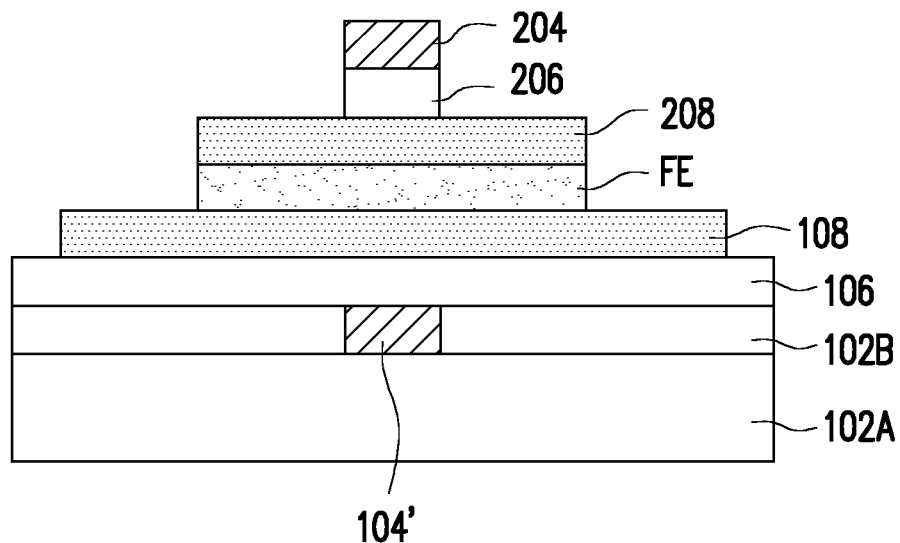

FIG. 6A is a top view of one stage in a method of fabricating a semiconductor device according to some embodiments of the present disclosure. FIG. 6B is a sectional view of the structure shown in FIG. 6A taken along the line A-A'. Referring to FIG. 6A and FIG. 6B, after forming the second gate 204 and the second gate dielectric 206, portions of the ferroelectric layer FE and the second semiconductor layer 208 are further removed by patterning or etching processes. For example, the ferroelectric layer FE and the second semiconductor layer 208 are patterned to reveal portions of the first semiconductor layer 108. After the patterning or etching processes, sidewalls of the ferroelectric layer FE are aligned with sidewalls of the second semiconductor layer 208. In some embodiments, the first semiconductor layer 108 is also slightly patterned or etched.

Figure 7A:
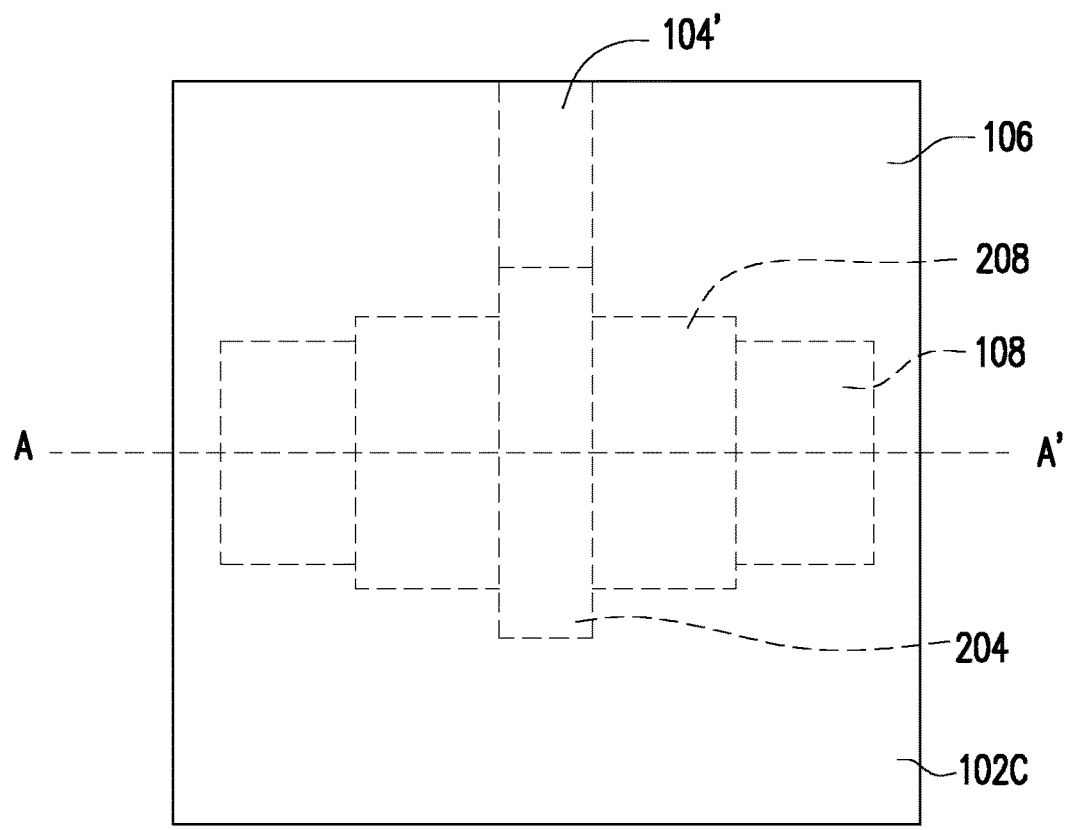
Figure 7B:
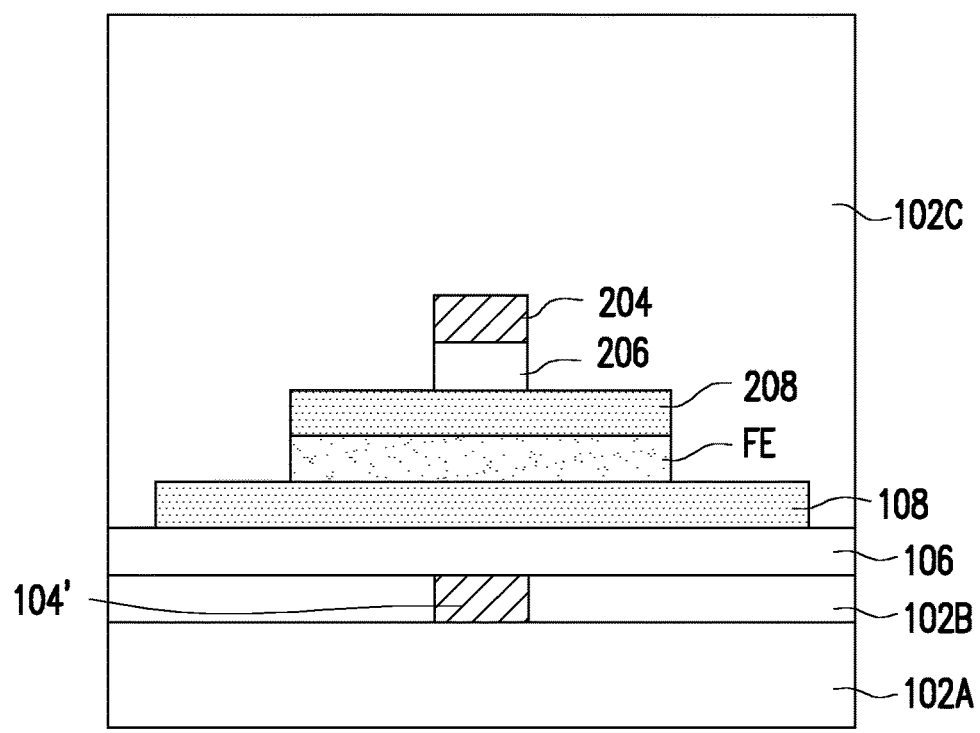

FIG. 7A is a top view of one stage in a method of fabricating a semiconductor device according to some embodiments of the present disclosure. FIG. 7B is a sectional view of the structure shown in FIG. 7A taken along the line A-A'. Referring to FIG. 7A and FIG. 7B, in a subsequent step, a dielectric layer 102C (or interlayer dielectric layer) is formed over the first gate dielectric 106 to cover and surround the first semiconductor layer 108, the ferroelectric layer FE, the second semiconductor layer 208, the second gate dielectric 206 and the second gate 204. In some embodiments, the dielectric layer 102C is formed by the same method and is formed of similar materials as described for the dielectric layer 102A, thus its detailed description will be omitted herein. In some embodiments, a planarization process (e.g., a chemical-mechanical planarization (CMP) process) is performed on the dielectric layer 102C so that it has a substantially planar top surface.

Figure 8A:
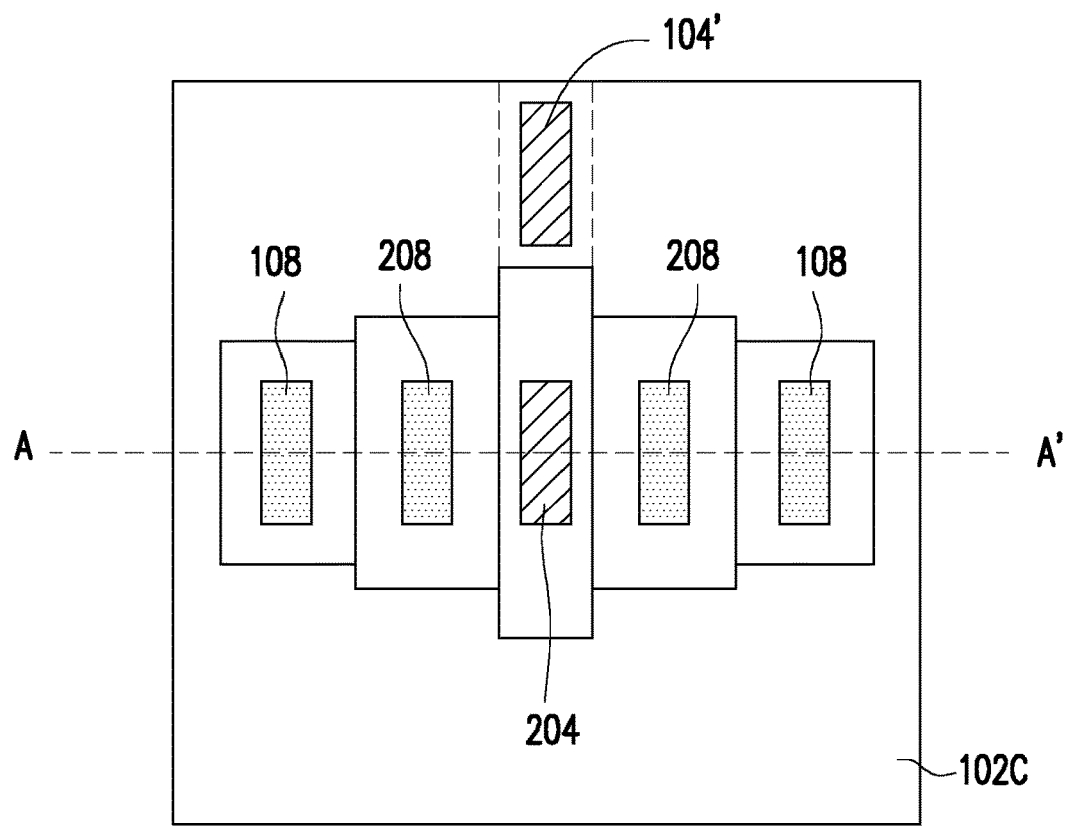
Figure 8B:
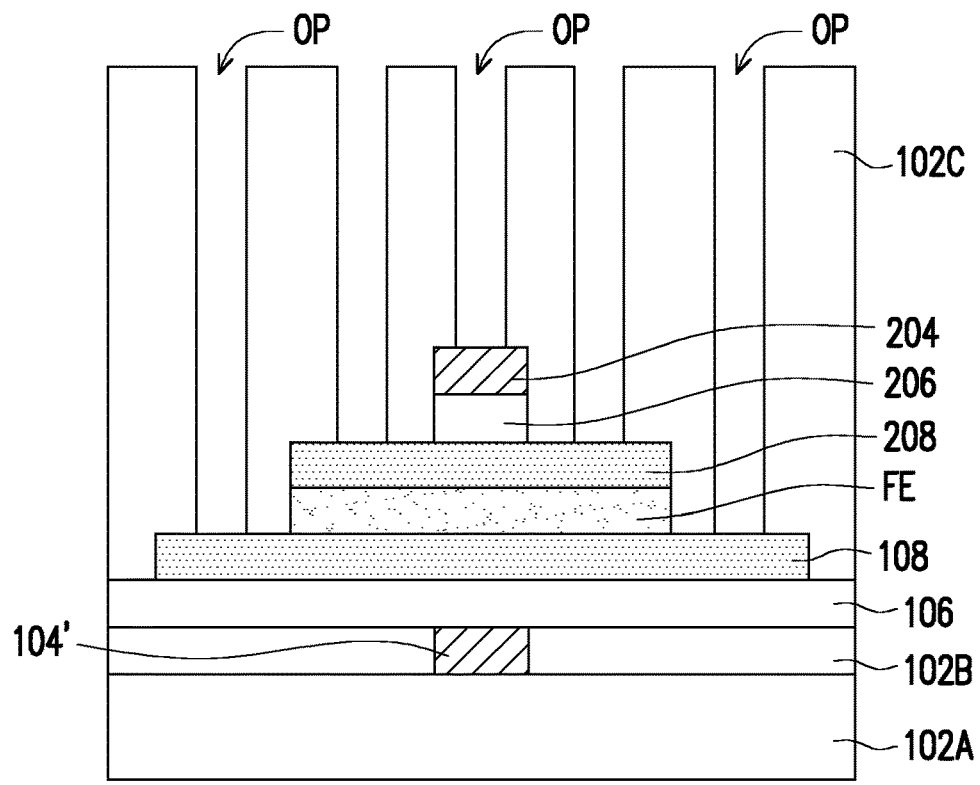

FIG. 8A is a top view of one stage in a method of fabricating a semiconductor device according to some embodiments of the present disclosure. FIG. 8B is a sectional view of the structure shown in FIG. 8A taken along the line A-A'. Referring to FIG. 8A and FIG. 8B, after forming the dielectric layer 102C, the dielectric layer 102C is patterned to form a plurality of openings OP revealing portions of the first gate 104', portions of the second gate 204, portions of the first semiconductor layer 108, and portions of the second semiconductor layer 208. For example, the plurality of openings OP reveals a top surface of the first gate 104', a top surface of the second gate 204, a top surface of the first semiconductor layer 108 (or first channel layer), and a top surface of the second semiconductor layer 208 (or second channel layer).

Figure 9A:
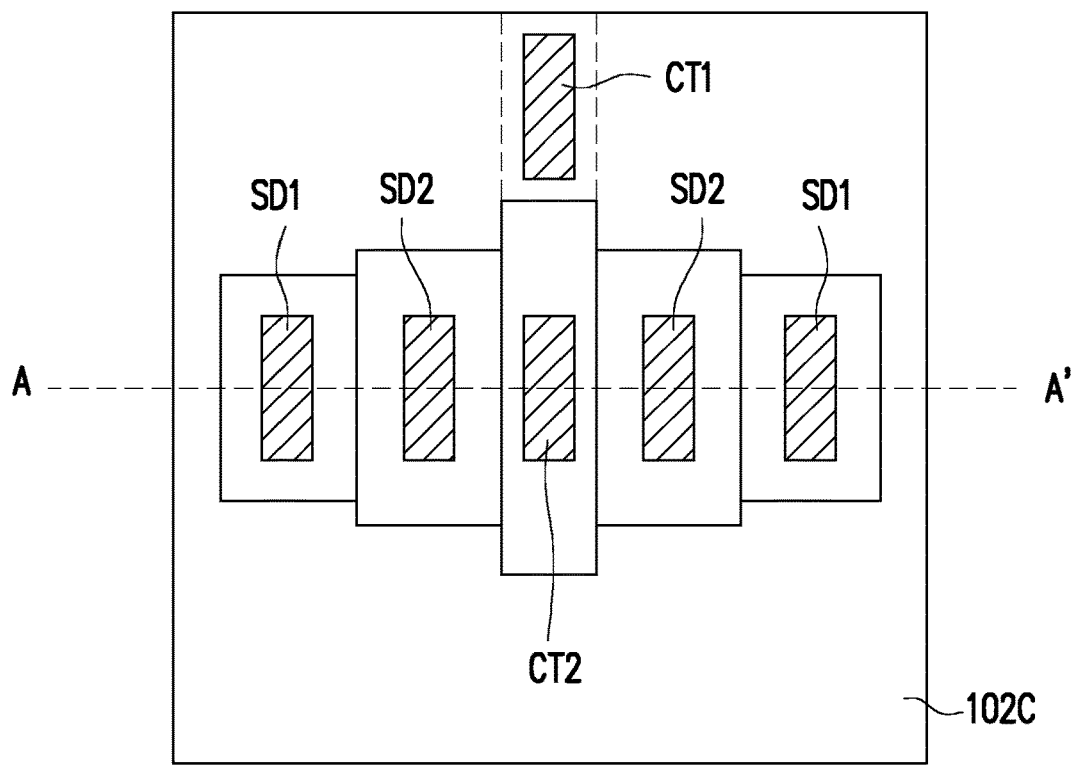
Figure 9B:
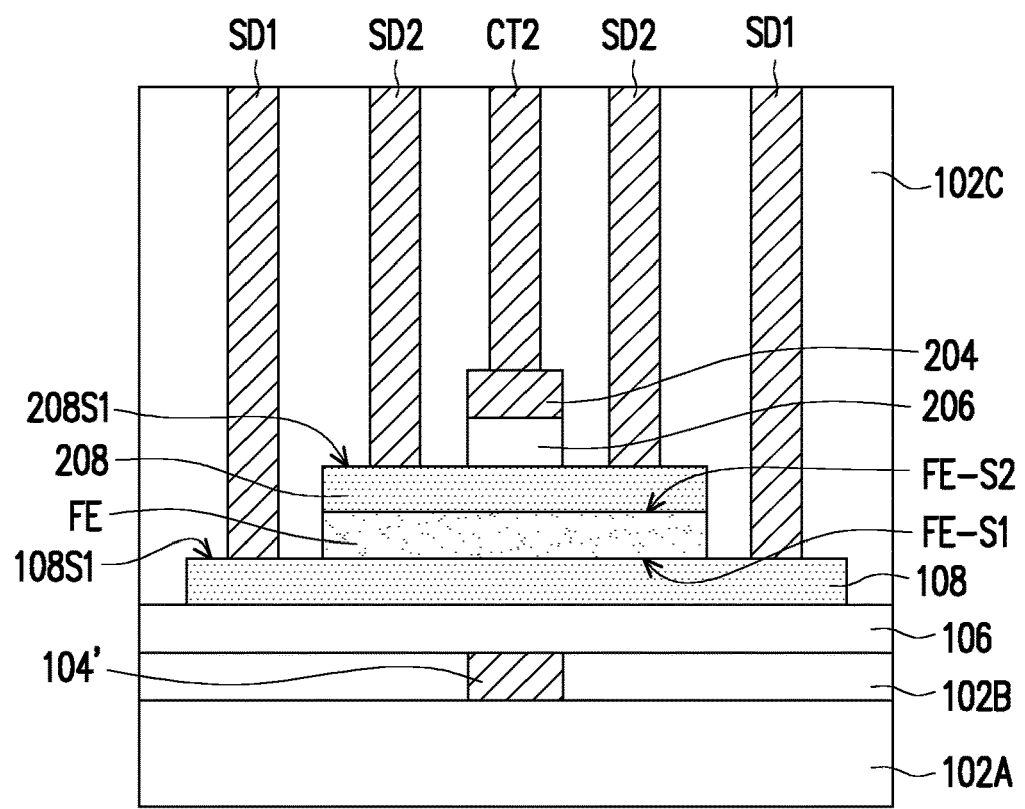

FIG. 9A is a top view of one stage in a method of fabricating a semiconductor device according to some embodiments of the present disclosure. FIG. 9B is a sectional view of the structure shown in FIG. 9A taken along the line A-A'. Referring to FIG. 9A and FIG. 9B, in a subsequent step, the openings OP are filled with conductive materials to form contact structures (CT1, CT2, SD1, SD2) connected to the first gate 104', the second gate 204, the first semiconductor layer 108 (or first channel layer) and the second semiconductor layer 208 (or second channel layer). For example, the conductive materials include copper, aluminum, tungsten, titanium nitride (TiN), tantalum nitride (TaN), some other conductive materials, or any combinations thereof. In some embodiments, the contact structure includes first source and drain contacts SD1, second source and drain contacts SD2, a first gate contact CT1 and a second gate contact CT2. After forming the contact structures (CT1, CT2, SD1, SD2), a semiconductor device D100 according to some embodiments of the present disclosure is accomplished.

As illustrated in FIG. 9A and FIG. 9B, the first source and drain contacts SD1 are connected to a first side 108S1 of the first semiconductor layer 108 (first channel layer), wherein the first side 108S1 of the first semiconductor layer 108 is facing the ferroelectric layer FE. In some embodiments, the second source and drain contacts SD2 are connected to a first side 208S1 of the second semiconductor layer 208 (second channel layer), wherein the first side 208S1 of the second semiconductor layer 208 is facing away from the ferroelectric layer FE. Furthermore, the ferroelectric layer FE (or insulating layer) and the second semiconductor layer 208 (second channel layer) are located in between the first source and drain contacts SD1 (between two SD1), while the second gate 204 and the second gate dielectric 206 are located in between the second source and drain contacts SD2 (between two SD2). In some embodiments, the first gate contact CT1 is connected to a top surface of the first gate 104', while the second gate contact CT2 is connected to a top surface of the second gate 204.

Furthermore, in the semiconductor device D100, the ferroelectric layer FE (insulating layer) has a first surface FE-S1 and a second surface FE-S2 opposite to the first surface FE-S1, whereby the first semiconductor layer 108 is disposed on the first surface FE-S1 of the ferroelectric layer FE, while the second semiconductor layer 208 is disposed on the second surface FE-S2 of the ferroelectric layer FE. In some embodiments, the first gate 104' is disposed on the first semiconductor layer 108 over the first surface FE-S1, while the second gate 204 is disposed on the second semiconductor layer 208 over the second surface FE-S2. In some embodiments, sidewalls of the ferroelectric layer FE are aligned with sidewalls of the second semiconductor layer 208, and are not aligned with sidewalls of the first semiconductor layer 108.

In the exemplary embodiment, the first gate 104', the first gate dielectric 106, the first semiconductor layer 108 (or first channel layer) and the first source and drain contacts SD1 are part of a first transistor, whereas the second gate 204, the second gate dielectric 206, the second semiconductor layer 208 (or second channel layer) and the second source and drain contacts SD2 are part of a second transistor. By supplying a transistor on either side of the ferroelectric layer (FE) in the semiconductor device D100, a differential pair structure design may be obtained. Exemplary read and write operations of the semiconductor device D100 will be described in more details with reference to FIG. 10 to FIG. 13.

Figure 10:
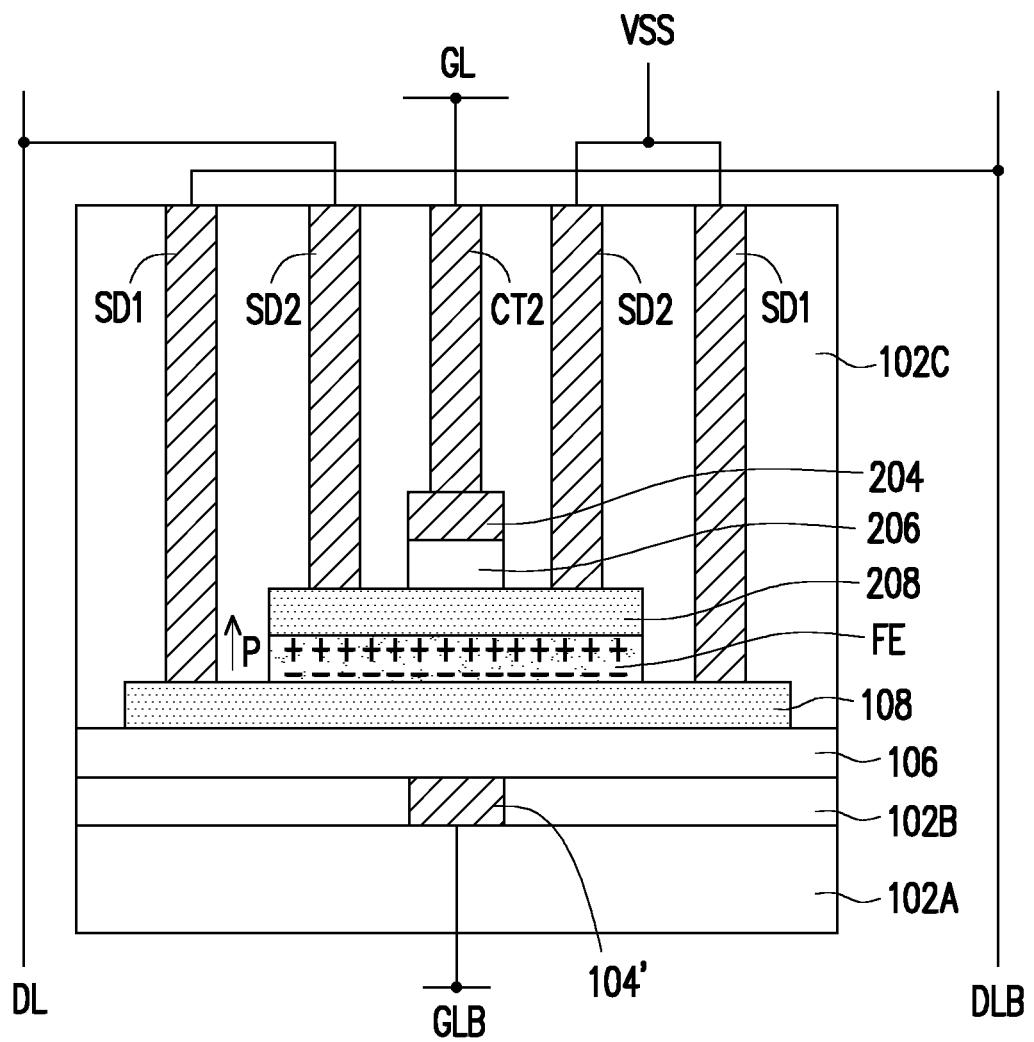
FIG. 10 is a schematic sectional view of a semiconductor device during an exemplary read operation of the semiconductor device according to some embodiments of the present disclosure.

FIG. 10 is a schematic sectional view of a semiconductor device (the semiconductor device D100) during an exemplary read operation of the semiconductor device according to some embodiments of the present disclosure. In exemplary embodiments, the ferroelectric layer FE may have a "P up" polarization state or a "P down" polarization state depending on the immobile sheet charges located at the interfaces of the ferroelectric layer FE. For example, during "P up" polarization illustrated in FIG. 10, the ferroelectric layer FE has negative sheet charge at the interface of the first transistor (104', 106, 108, SD1), and has positive sheet charge at the interface of the second transistor (204, 206, 208, SD2). In other words, the negative sheet charge at the first semiconductor layer 108 (or first channel layer) of the first transistor repels electrons, which increases the threshold voltage. On the other hand, the positive sheet charge at the second semiconductor layer 208 (or second channel layer) of the second transistor attracts electrons, which decreases the threshold voltage. As such, the two transistor of the semiconductor device D100 will have two threshold voltages, and one transistor will always be in the complementary state of the other.

Referring to FIG. 10, during a read operation of such embodiment, the drain line DL (coupled to one second source and drain contact SD2) and the drain line bar DLB (coupled to one first source and drain contact SD1) are pre-charged by biasing both of them to a certain voltage. Hereafter, the gate line GL (coupled to the second gate contact CT2 or second gate 204) and the gate line bar GLB (coupled to the first gate contact CT1 or first gate 104') are biased between a first threshold voltage and a second threshold voltage. Depending on the polarization state of the ferroelectric layer FE, the first or the second transistor turns on and discharges its respective drain line (DL/DLB) which results in a change of its respective voltage. A sense amplifier may be used to perform read out by measuring the sign (i.e., positive or negative) of the voltage difference between drain line DL and drain line bar DLB.

Figure 11:
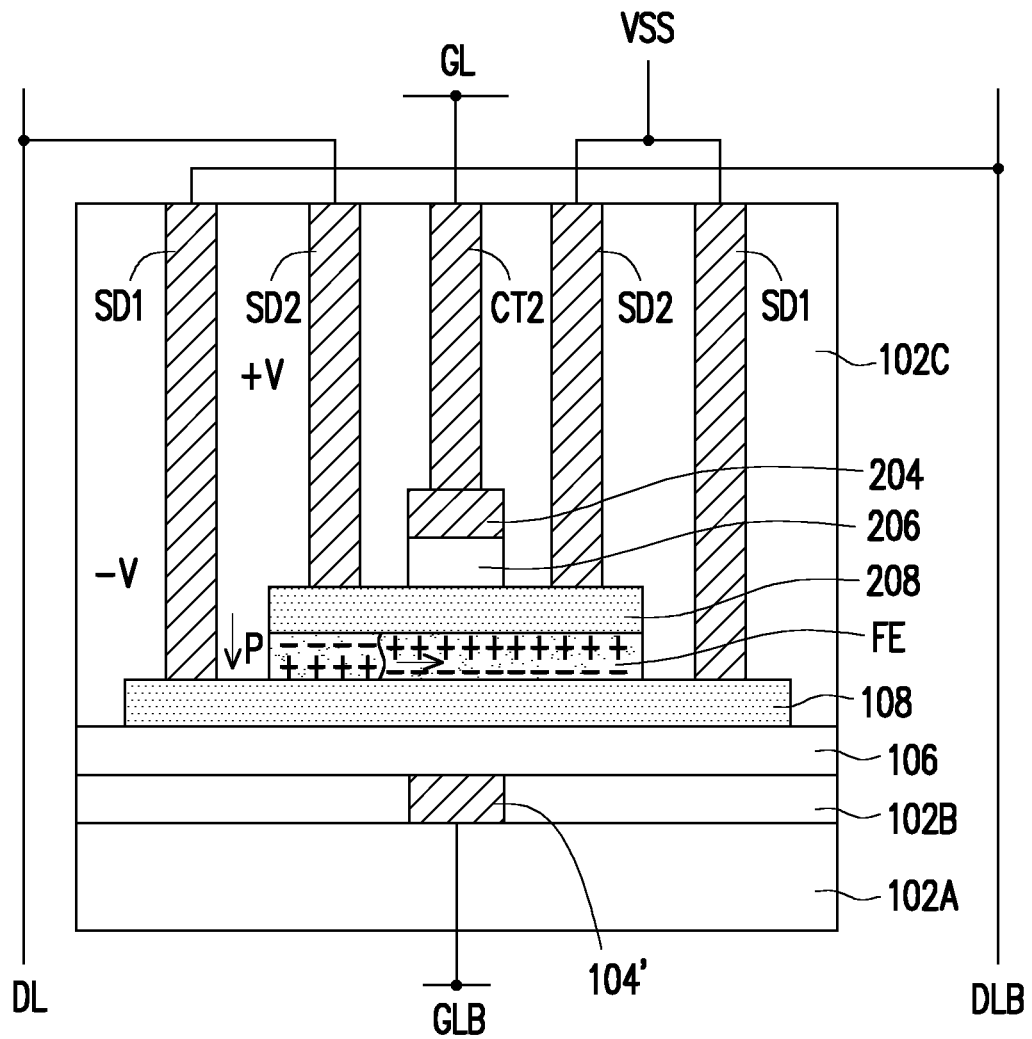
FIG. 11 is a schematic sectional view of a semiconductor device during an exemplary write operation of the semiconductor device according to some embodiments of the present disclosure.

FIG. 11 is a schematic sectional view of a semiconductor device (the semiconductor device D100) during an exemplary write operation of the semiconductor device according to some embodiments of the present disclosure. Referring to FIG. 11, in the exemplary embodiment, the ferroelectric layer FE is for example a single-crystalline ferroelectric material. In such embodiment, there are no domain walls in the polarization state of the ferroelectric layer FE due to the absence of polycrystalline grains. Therefore, when writing "down" (P down) by applying a positive voltage between the drain line DL and drain line bar DLB, the electric field over the ferroelectric layer FE locally exceeds the coercive field. Furthermore, the "down" polarization (P down) will have extended across the entire ferroelectric layer FE, and the domain wall between P "down" and P "up" propagating like a phonon-wave with the speed of sound. In other words, the ferroelectricity may propagate in the single crystalline material (ferroelectric layer FE) towards the source (coupled to ground voltage VSS) essentially by the speed of sound.

Figure 12:
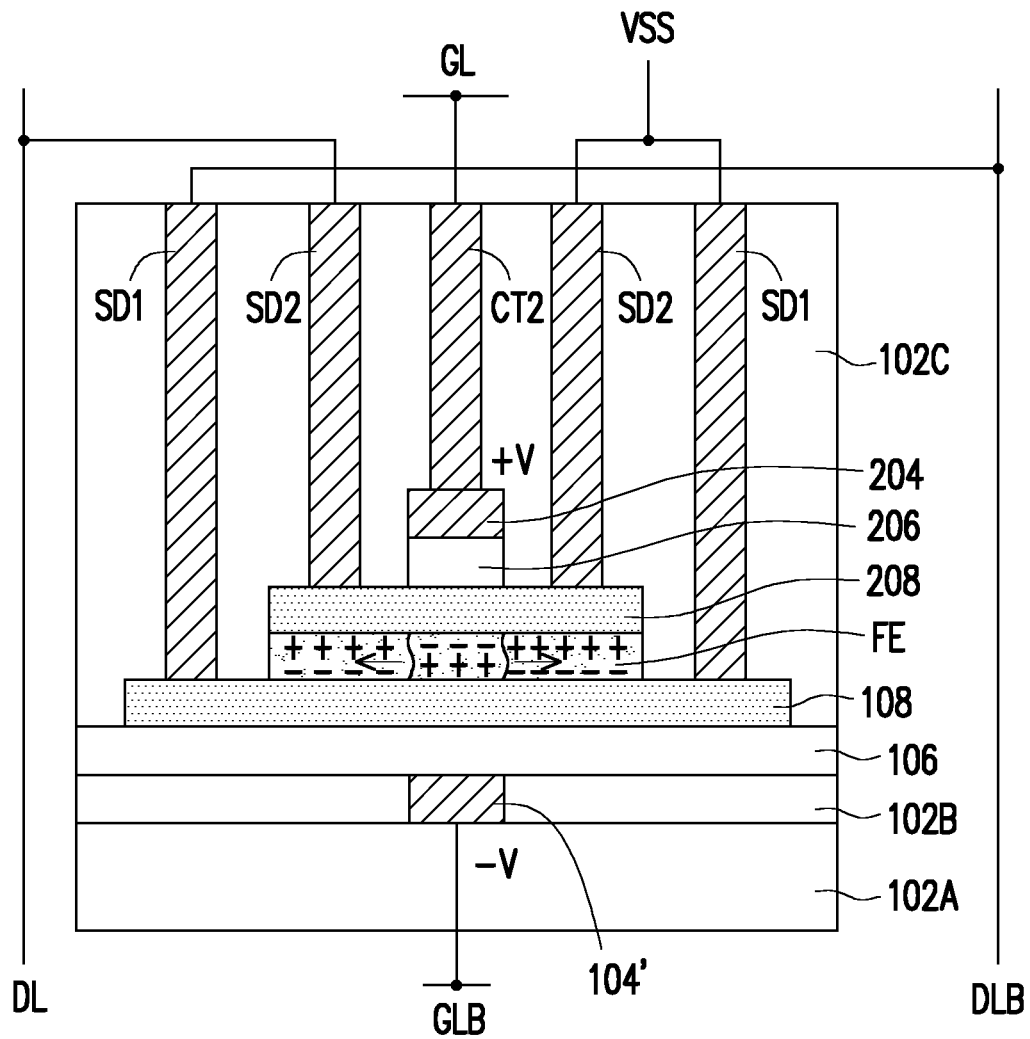
FIG. 12 is a schematic sectional view of a semiconductor device during an exemplary write operation of the semiconductor device according to some other embodiments of the present disclosure.

FIG. 12 is a schematic sectional view of a semiconductor device (the semiconductor device D100) during an exemplary write operation of the semiconductor device according to some other embodiments of the present disclosure. Referring to FIG. 12, in the exemplary embodiment, the ferroelectric layer FE is also a single-crystalline ferroelectric material. In such embodiment, assuming that the ferroelectric propagation works in the single crystalline material (ferroelectric layer FE), when writing "down" (P down) by applying a positive voltage between gate line GL and gate line bar GLB, the electric field over the ferroelectric layer FE locally exceeds the coercive field. Furthermore, the "down" polarization (P down) will have propagated from a region between the first gate 104' and the second gate 204 towards the source and drain regions on two sides of the ferroelectric layer FE essentially by the speed of sound.

Figure 13:
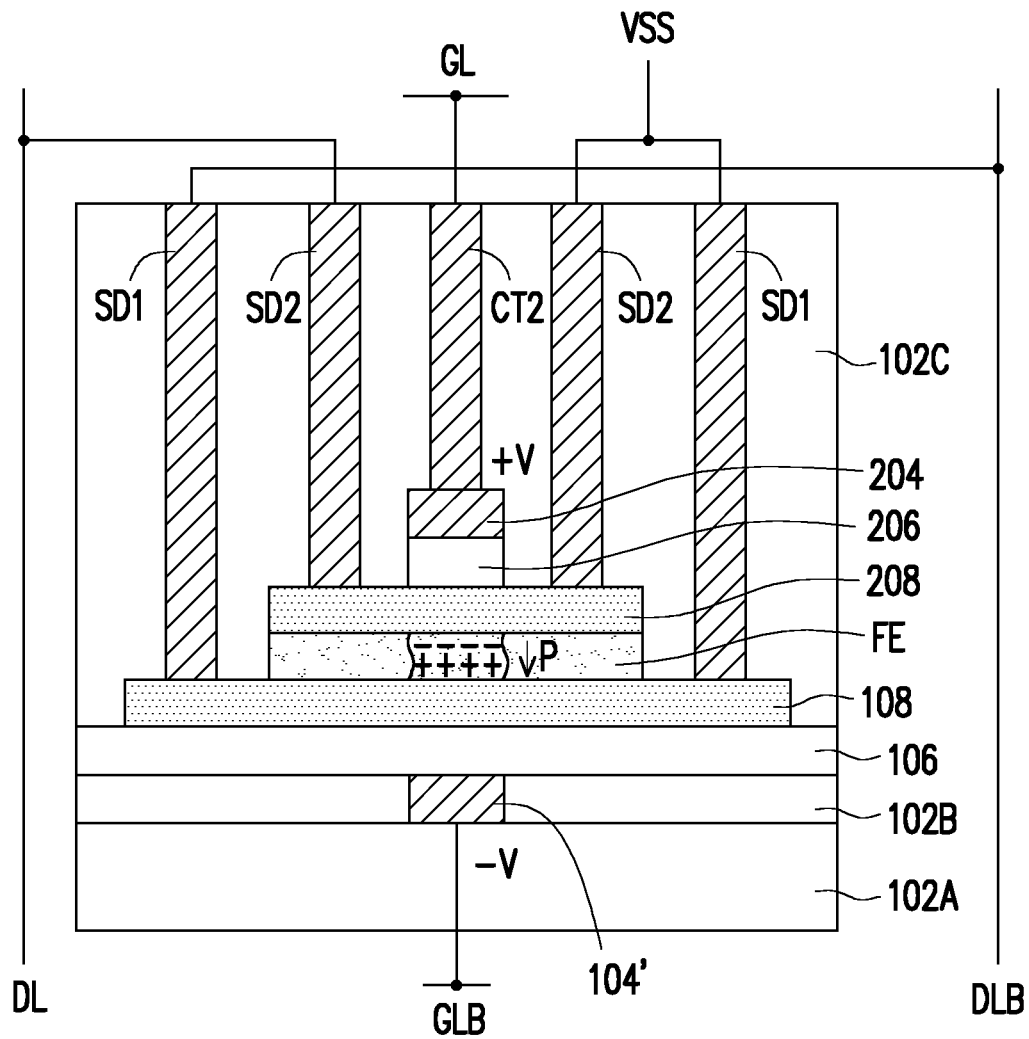
FIG. 13 is a schematic sectional view of a semiconductor device during an exemplary write operation of the semiconductor device according to some other embodiments of the present disclosure.

FIG. 13 is a schematic sectional view of a semiconductor device (the semiconductor device D100) during an exemplary write operation of the semiconductor device according to some other embodiments of the present disclosure. Referring to FIG. 13, in the exemplary embodiment, the ferroelectric layer FE is not a single crystalline material, and polycrystalline materials (having grain boundaries) are used instead. In such embodiment, the ferroelectric propagation does not work in the ferroelectric layer FE. For example, a propagating domain wall between two different polarization states cannot pass the grain boundary of the polycrystalline material, and the grain boundary will pin the domain wall, thereby preventing the polarization from spreading to the entire layer. As a result, when writing "down" (P down) by applying a positive voltage between gate line GL and gate line bar GLB, the polarization is switched locally below the gated area (between the first gate 104' and the second gate 204) without propagation. On the hand, the non-switched part of the ferroelectric layer FE will be in a random state (net zero polarization).

In the semiconductor device D100 of the exemplary embodiment, the ferroelectric layer FE is shared between two transistors at two opposite sides to form a differential pair structure design. As such, when one transistor writes the polarization in one of the two stable states, the other transistor will always be in the complementary state. Therefore, the writing of such semiconductor device D100 can be completed in one operation, and reading can be done differentially, like in static random-access memory (SRAM).

Figure 14:
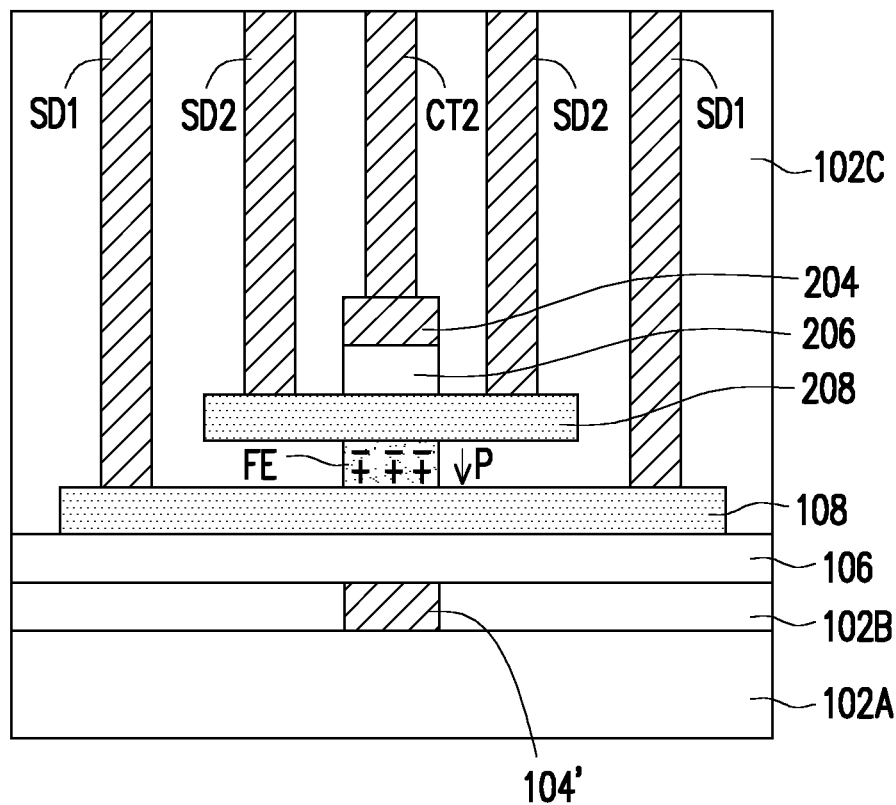
FIG. 14 is a schematic sectional view of a semiconductor device according to some other embodiments of the present disclosure.

FIG. 14 is a schematic sectional view of a semiconductor device according to some other embodiments of the present disclosure. The semiconductor device D200 illustrated in FIG. 14 is similar to the semiconductor device D100 illustrated in FIG. 9B to FIG. 13. Therefore, the same reference numerals are used to refer to the same or liked parts, and its detailed description will be omitted herein. Referring to FIG. 14, in some embodiments, the ferroelectric layer FE is not a single crystalline material, and polycrystalline materials (having grain boundaries) are used instead. Since the random state (net zero polarization) of the ferroelectric layer FE is not desired in this embodiment, the extend of the ferroelectric layer FE is limited to the gated area (between the first gate 104' and the second gate 204). In other words, in the illustrated embodiment, sidewalls of the ferroelectric layer FE are substantially aligned with sidewalls of the first gate 104' and sidewalls of the second gate 204.

Similarly, in the semiconductor device D200 of the exemplary embodiment, the ferroelectric layer FE is shared between two transistors at two opposite sides to form a differential pair structure design. As such, when one transistor writes the polarization in one of the two stable states, the other transistor will always be in the complementary state. Therefore, the writing of such semiconductor device D200 can be completed in one operation, and reading can be done differentially, like in static random-access memory (SRAM).

Figure 15:
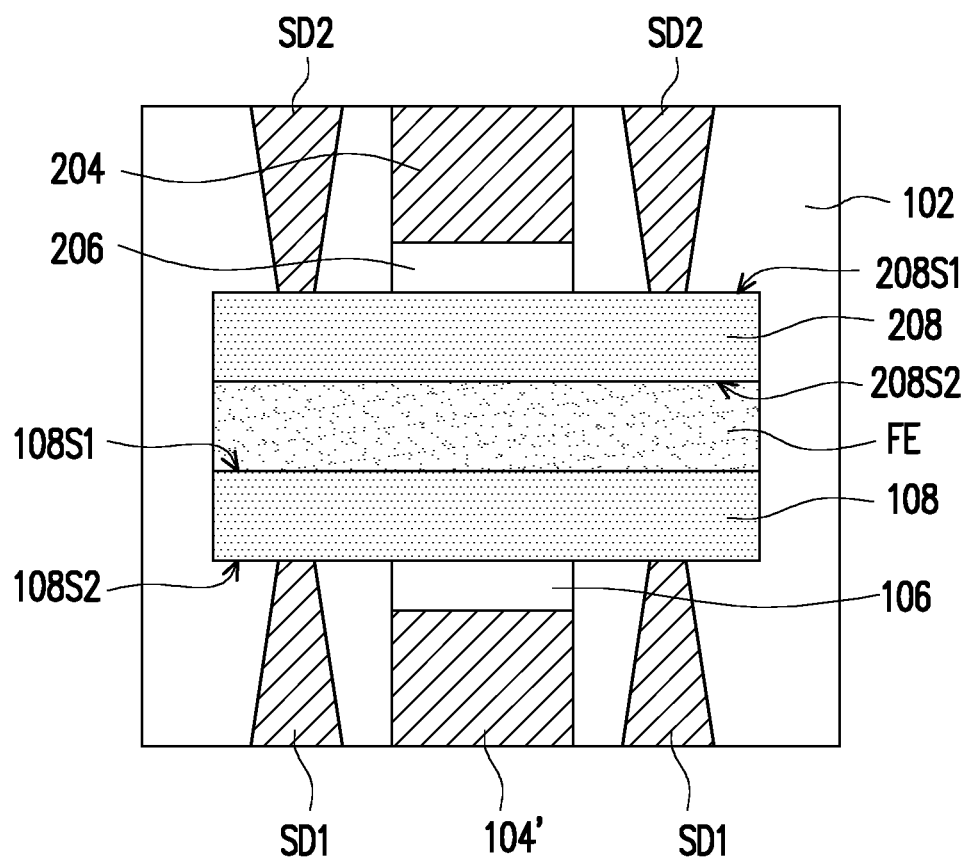
FIG. 15 is a schematic sectional view of a semiconductor device according to some other embodiments of the present disclosure.

FIG. 15 is a schematic sectional view of a semiconductor device according to some other embodiments of the present disclosure. The semiconductor device D300 illustrated in FIG. 15 is similar to the semiconductor device D100 illustrated in FIG. 9B to FIG. 13. Therefore, the same reference numerals are used to refer to the same or liked parts, and its detailed description will be omitted herein. In the semiconductor device D100 of the previous embodiment, the first source and drain contacts SD1 and the second source and drain contacts SD are contacting the first semiconductor layer 108 (first channel layer) and the second semiconductor layer 208 (second channel layer) from the top of the semiconductor device D100. In other words, the first source and drain contacts SD1 and the second source and drain contacts SD are respectively located over top surfaces of the first semiconductor layer 108 and the second semiconductor layer 208. However, the disclosure is not limited thereto. For example, in an alternative embodiment illustrated in FIG. 15, the first source and drain contacts SD1 are contacting the first semiconductor layer 108 from the bottom of the semiconductor device D100.

As illustrated in the semiconductor device D300 of FIG. 15, in some embodiments, the first gate 104', the first gate dielectric 106 and the first source and drain contacts SD1 are located on a second side 108S2 of the first semiconductor layer 108 (or first channel layer). The second side 108S2 being opposite to the first side 108S1 of the first semiconductor layer 108, whereby the first side 108S1 faces the ferroelectric layer FE and the second side 108S2 faces away from the ferroelectric layer FE. Furthermore, in some embodiments, the second gate 204, the second gate dielectric 206 and the second source and drain contacts SD2 are located on the first side 208S1 of the second semiconductor layer 208. The first side 208S1 being opposite to a second side 208S2 of the second semiconductor layer 208, whereby the second side 208S2 faces the ferroelectric layer FE and the first side 208S1 faces away from the ferroelectric layer FE.

In the semiconductor device D300, the first gate 104', the first gate dielectric 106, the first semiconductor layer 108 (or first channel layer) and the first source and drain contacts SD1 are part of a first transistor, whereas the second gate 204, the second gate dielectric 206, the second semiconductor layer 208 (or second channel layer) and the second source and drain contacts SD2 are part of a second transistor. The first and second transistors are located on two opposing sides of the ferroelectric layer FE, and the first and second transistors along with the ferroelectric layer FE are embedded within an interlayer dielectric layer 102. It should be noted that there may be multiple dielectric layers in the interlayer dielectric layer 102. Furthermore, the interlayer dielectric layer 102 may be provided over a substrate (not shown) compatible with a back-end-of-line (BEOL) process of the semiconductor device D300.

In the exemplary embodiment, the first gate 104' and the first source and drain contacts SD1 are formed in the same step through selective patterning or etching processes. Thereafter, dielectric layers (part of the interlayer dielectric layer 102) may be formed to cover the first gate 104' and the first source and drain contacts SD1, whereby the topmost dielectric layer is etched to form openings revealing the first gate 104'. Subsequently, the first gate dielectric 106 may be formed in the openings over the first gate 104', and the first semiconductor layer 108 (or first channel layer), the ferroelectric layer FE, the second semiconductor layer 208 (or second channel layer), the second gate dielectric 206, the second gate 204 and the second source and drain contacts SD2 may be sequentially formed over the first gate dielectric 106 and over the dielectric layers (part of the interlayer dielectric layer 102).

Similarly, in the semiconductor device D300 of the exemplary embodiment, the ferroelectric layer FE is shared between two transistors at two opposite sides to form a differential pair structure design. As such, when one transistor writes the polarization in one of the two stable states, the other transistor will always be in the complementary state. Therefore, the writing of such semiconductor device D300 can be completed in one operation, and reading can be done differentially, like in static random-access memory (SRAM).

Figure 16:
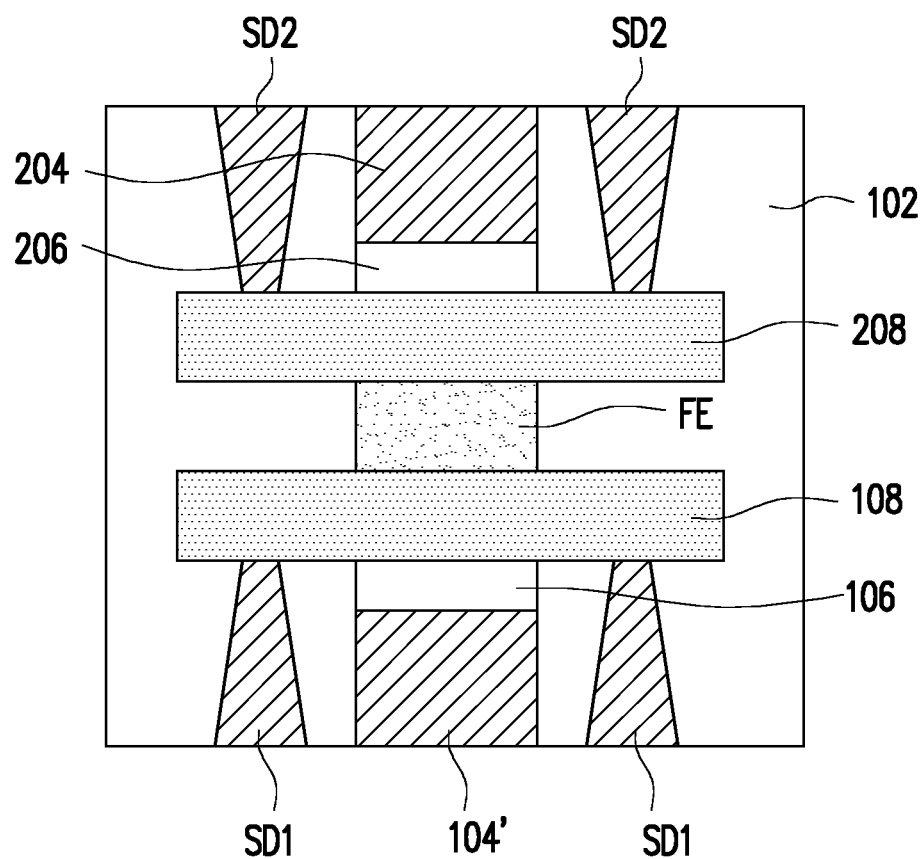
FIG. 16 is a schematic sectional view of a semiconductor device according to some other embodiments of the present disclosure.

FIG. 16 is a schematic sectional view of a semiconductor device according to some other embodiments of the present disclosure. The semiconductor device D400 illustrated in FIG. 16 is similar to the semiconductor device D300 illustrated in FIG. 15. Therefore, the same reference numerals are used to refer to the same or liked parts, and its detailed description will be omitted herein. Referring to FIG. 16, in some embodiments, the ferroelectric layer FE is not a single crystalline material, and polycrystalline materials (having grain boundaries) are used instead. Since the random state (net zero polarization) of the ferroelectric layer FE is not desired in this embodiment, the extend of the ferroelectric layer FE is limited to the gated area (between the first gate 104' and the second gate 204). In other words, in the illustrated embodiment, sidewalls of the ferroelectric layer FE are substantially aligned with sidewalls of the first gate 104' and sidewalls of the second gate 204.

Similarly, in the semiconductor device D400 of the exemplary embodiment, the ferroelectric layer FE is shared between two transistors at two opposite sides to form a differential pair structure design. As such, when one transistor writes the polarization in one of the two stable states, the other transistor will always be in the complementary state. Therefore, the writing of such semiconductor device D400 can be completed in one operation, and reading can be done differentially, like in static random-access memory (SRAM).

Figure 17A:
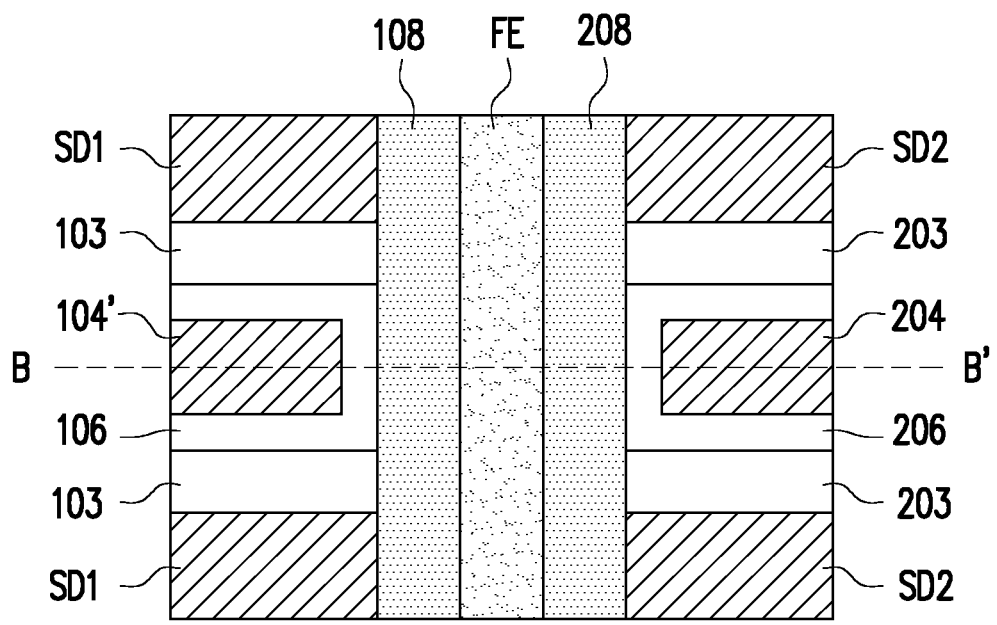
FIG. 17A and FIG. 17B are schematic top views and sectional views of a semiconductor device according to some other embodiments of the present disclosure.
Figure 17B:
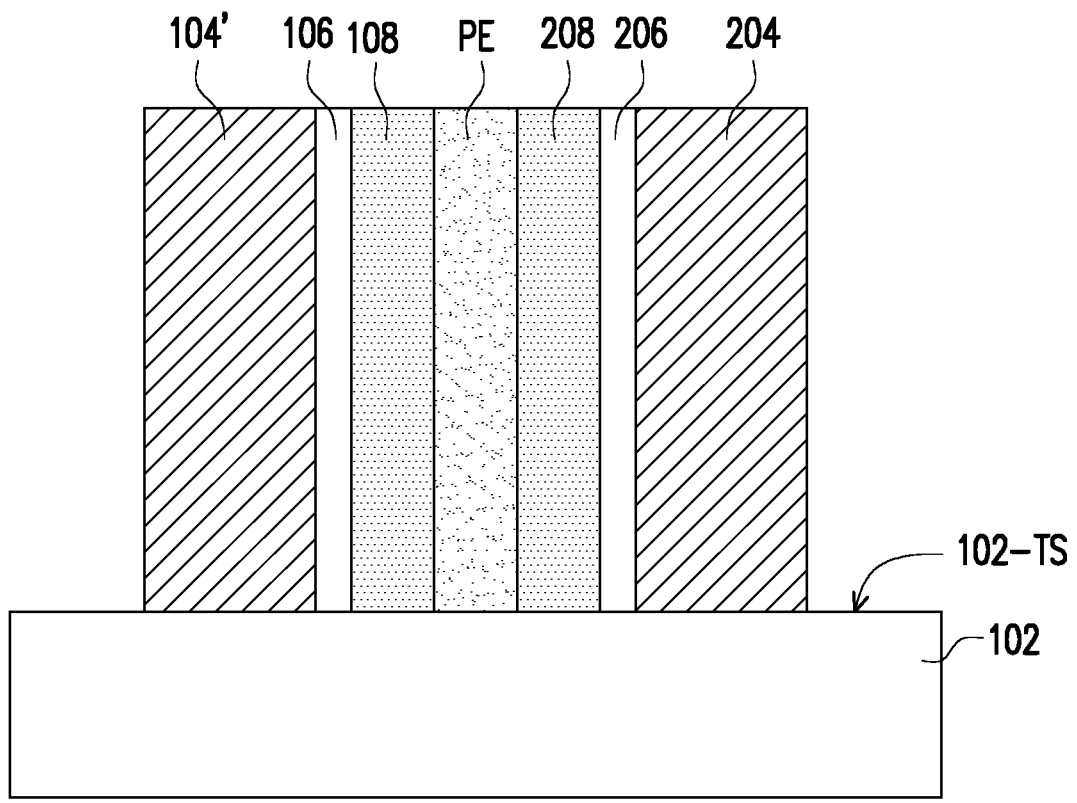

FIG. 17A is a top view of one stage in a method of fabricating a semiconductor device according to some embodiments of the present disclosure. FIG. 17B is a sectional view of the structure shown in FIG. 17A taken along the line B-B'. The semiconductor device D500 illustrated in FIG. 17A and FIG. 17B is similar to the semiconductor device D100 illustrated in FIG. 9B to FIG. 13. Therefore, the same reference numerals are used to refer to the same or liked parts, and its detailed description will be omitted herein. In the semiconductor device D100, the first semiconductor layer 108, the ferroelectric layer FE and the second semiconductor layer 208 are formed and stacked up along a build-up direction over the dielectric layer 102A. However, the disclosure is not limited thereto, and in an alternative embodiment shown in FIG. 17A and FIG. 17B, the first semiconductor layer 108, the ferroelectric layer FE and the second semiconductor layer 208 are stacked vertically over the interlayer dielectric layer 102 (dielectric layer).

Referring to FIG. 17A and FIG. 17B, in some embodiments, the ferroelectric layer FE, the first semiconductor layer 108, the second semiconductor layer 208, the first gate 104', the first gate dielectric 106, the second gate 204 and the second gate dielectric 206 are all located on the same top surface 102-TS of the interlayer dielectric layer 102 (dielectric layer). For example, the interlayer dielectric layer 102 is provided over a substrate (not shown) compatible with a back-end-of-line (BEOL) process of the semiconductor device D500. In some embodiments, a top surface of the ferroelectric layer FE is aligned with top surfaces of the first semiconductor layer 108 (first channel layer) and the second semiconductor layer 208 (second channel layer). In certain embodiments, the first source and drain contacts SD1 are located on the top surface 102-TS of the interlayer dielectric layer 102 on two sides of the first gate 104', whereby first spacers 103 are separating the first gate 104' from the first source and drain contacts SD1. Similarly, the second source and drain contacts SD2 are located on the top surface 102-TS of the interlayer dielectric layer 102 on two sides of the second gate 204, whereby second spacers 203 are separating the second gate 204 from the second source and drain contacts SD2.

In the semiconductor device D500, the first gate 104', the first gate dielectric 106, the first semiconductor layer 108 (or first channel layer) and the first source and drain contacts SD1 are part of a first transistor, whereas the second gate 204, the second gate dielectric 206, the second semiconductor layer 208 (or second channel layer) and the second source and drain contacts SD2 are part of a second transistor. The first and second transistors are located on two opposing sides of the ferroelectric layer FE (insulating layer).

Similarly, in the semiconductor device D500 of the exemplary embodiment, the ferroelectric layer FE is shared between two transistors at two opposite sides to form a differential pair structure design. As such, when one transistor writes the polarization in one of the two stable states, the other transistor will always be in the complementary state. Therefore, the writing of such semiconductor device D500 can be completed in one operation, and reading can be done differentially, like in static random-access memory (SRAM).

In the above-mentioned embodiments, by supplying a transistor channel on either side of the ferroelectric layer, a differential pair semiconductor structure may be obtained. Since the ferroelectric layer has two stable polarization states with different sign ("P up" and "P down"), the threshold voltage ($V_t$) difference between adjacent transistors can have two signs. As such, when one transistor writes the polarization in one of the two stable states, the other transistor will always be in the complementary state. Furthermore, due to the complementary state of the two transistors, the writing of the semiconductor device can be completed in one operation, and reading of the semiconductor device can be made easy by detecting a sign (positive or negative, e.g., a positive or negative difference in the voltage of two drain lines DL and DLB), rather than an absolute number, and the reading can be done differentially like in SRAM devices. Overall, an extremely compact and non-volatile differential pair design can be accomplished in the semiconductor device.

In accordance with some embodiments of the present disclosure, a semiconductor device includes a ferroelectric layer, a first semiconductor layer, a first gate, a second semiconductor layer, a second gate and contact structures. The ferroelectric layer has a first surface and a second surface opposite to the first surface. The first semiconductor layer is disposed on the first surface of the ferroelectric layer. The first gate is disposed on the first semiconductor layer over the first surface. The second semiconductor layer is disposed on the second surface of the ferroelectric layer. The second gate is disposed on the second semiconductor layer over the second surface. The contacts structures are connected to the first semiconductor layer and the second semiconductor layer.

In accordance with some other embodiments of the present disclosure, a semiconductor device includes a first transistor, a second transistor and an insulating ferroelectric layer. The first transistor includes a first channel layer, a first gate and first source and drain contacts. The first gate is disposed on the first channel layer and the first source and drain contacts are connected to the first channel layer. The second transistor includes a second channel layer, a second gate and second source and drain contacts. The second gate is disposed on the second channel layer, and the second source and drain contacts are connected to the second channel layer. The insulating layer is located in between the first transistor and the second transistor, wherein the insulating layer is contacting the first channel layer and the second channel layer.

In accordance with yet another embodiment of the present disclosure, a method of fabricating a semiconductor device is described. The method includes the following steps. A first gate is formed on a dielectric layer. A first semiconductor layer, a ferroelectric layer, and a second semiconductor layer are sequentially formed along a first direction over the first gate, wherein the ferroelectric layer is sandwiched between the first semiconductor layer and the second semiconductor layer. A second gate is formed over the second semiconductor layer. Contact structures are formed to be connected to the first semiconductor layer and the second semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a ferroelectric layer having a first surface and a second surface opposite to the first surface;
    a first semiconductor layer disposed on the first surface of the ferroelectric layer;
    a first gate disposed on the first semiconductor layer over the first surface;
    a second semiconductor layer disposed on the second surface of the ferroelectric layer;
    a second gate disposed on the second semiconductor layer over the second surface; and
    contact structures connected to the first semiconductor layer and the second semiconductor layer.

2. The semiconductor device according to claim 1, wherein sidewalls of the ferroelectric layer are aligned with sidewalls of the first semiconductor layer or aligned with sidewalls of the second semiconductor layer.

3. The semiconductor device according to claim 1, wherein sidewalls of the ferroelectric layer are aligned with sidewalls of the first semiconductor layer and sidewalls of the second semiconductor layer.

4. The semiconductor device according to claim 1, wherein sidewalls of the ferroelectric layer are aligned with sidewalls of the first gate and sidewalls of the second gate.

5. The semiconductor device according to claim 1, wherein the ferroelectric layer includes a single-crystalline ferroelectric material.

6. The semiconductor device according to claim 1, further comprising:
    a first gate dielectric located in between the first semiconductor layer and the first gate; and
    a second gate dielectric located in between the second semiconductor layer and the second gate.

7. The semiconductor device according to claim 1, wherein the contact structures comprise:

first source and drain contacts connected to a first side of the first semiconductor layer, wherein the first side of the first semiconductor layer is facing the ferroelectric layer; and second source and drain contacts connected to a first side of the second semiconductor layer, wherein the first side of the second semiconductor layer is facing away from the ferroelectric layer.

8. The semiconductor device according to claim 1, further comprising:

a dielectric layer, wherein the ferroelectric layer, the first semiconductor layer, the second semiconductor layer, the first gate and the second gate are located on a top surface of the dielectric layer and all in contact with the top surface.

9. A semiconductor device, comprising:

a first transistor comprising:
  a first channel layer;
  a first gate disposed on the first channel layer; and
  first source and drain contacts connected to the first channel layer;

a second transistor comprising:
  a second channel layer;
  a second gate disposed on the second channel layer; and
  second source and drain contacts connected to the second channel layer;

an insulating layer located in between the first transistor and the second transistor, wherein the insulating layer is contacting the first channel layer and the second channel layer.

10. The semiconductor device according to claim 9, wherein the insulating layer comprises a ferroelectric material selected from the group consisting of silicon doped hafnium oxide ($Si:HfO_2$), hafnium zirconium oxide ($HfZrO_2$), aluminum scandium nitride (AlScN) and aluminum yttrium nitride (AlYN).

11. The semiconductor device according to claim 9, wherein sidewalls of the insulating layer are aligned with sidewalls of the first channel layer or aligned with sidewalls of the second channel layer.

12. The semiconductor device according to claim 9, wherein sidewalls of the insulating layer are aligned with sidewalls of the first channel layer and sidewalls of the second channel layer.

13. The semiconductor device according to claim 9, wherein sidewalls of the insulating layer are aligned with sidewalls of the first gate and sidewalls of the second gate.

14. The semiconductor device according to claim 9, wherein the insulating layer and the second channel layer are located in between the first source and drain contacts, and the second gate is located in between the second source and drain contacts.

15. The semiconductor device according to claim 9, further comprising:

a first gate dielectric located in between the first channel layer and the first gate; and a second gate dielectric located in between the second channel layer and the second gate.

\* \* \* \* \*